(12) United States Patent
Lin et al.

(10) Patent No.: US 6,265,295 B1
(45) Date of Patent: Jul. 24, 2001

(54) METHOD OF PREVENTING TILTING OVER

(75) Inventors: Yi-Miaw Lin; Jhon-Jhy Liaw; Dun-Nian Yaung, all of Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/389,889

(22) Filed: Sep. 3, 1999

(51) Int. Cl.⁷ .................. H01L 21/3205; H01L 21/4763; H01L 21/336

(52) U.S. Cl. .................. 438/586; 438/303; 438/664; 438/672; 438/643

(58) Field of Search .................. 438/586, 663, 438/664, 303, 305, 643, 669, 672, 595, 637

(56) References Cited

U.S. PATENT DOCUMENTS

| | | | |
|---|---|---|---|
| 5,071,790 | 12/1991 | Kim | 437/195 |
| 5,536,681 | 7/1996 | Jang et al. | 437/195 |
| 5,744,378 | 4/1998 | Homma | 437/195 |
| 6,071,784 * | 6/2000 | Metha et al. | 438/303 |

* cited by examiner

Primary Examiner—Matthew Smith
Assistant Examiner—Igwe U. Anya
(74) Attorney, Agent, or Firm—George O. Saile; Stephen B. Ackerman

(57) ABSTRACT

A new method is provided for the creation of metal plugs. After the gate electrode structures have been created on the surface of a semiconductor substrate, the Inter Level Dielectric (ILD) is deposited over the poly gates. The layer of ILD is polished, a second layer of dielectric is deposited over the layer of ILD. A stop layer is deposited over the second layer of dielectric, a Rapid Thermal Annealing (RTA) is performed to the stop layer and the thin layer of dielectric. The metal plugs are then patterned and deposited after which the process proceeds for the further creation of the interconnect metal.

19 Claims, 2 Drawing Sheets

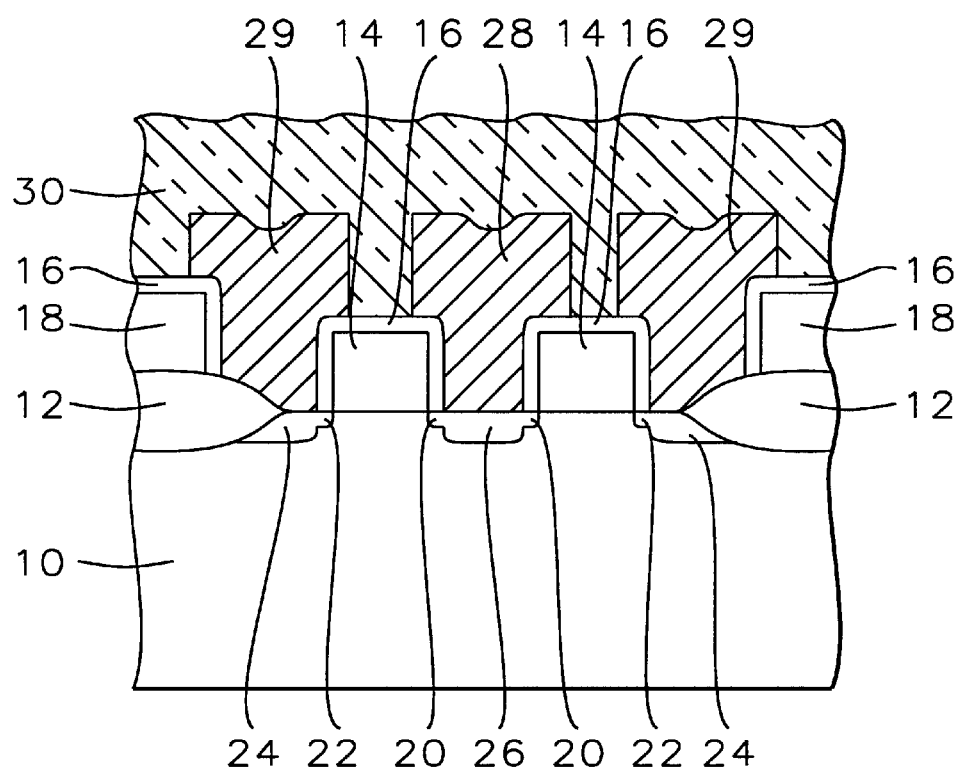
FIG. 1 – Prior Art
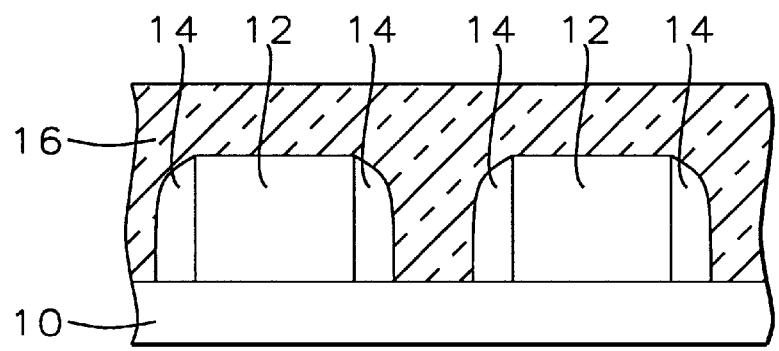
FIG. 2

METHOD OF PREVENTING TILTING OVER

BACKGROUND OF THE INVENTION

1. Field of the Invention

The invention relates to the fabrication of integrated circuit devices, and more particularly, to a method of preventing tilting of metal contact structures for quarter micron and deep sub-micron polysilicon gate devices.

2. Description of the Prior Art

Recent advances in the manufacturing of semiconductor devices have led to dramatic reductions of device feature sizes while simultaneously increasing device density and device performance, all the while keeping device production costs within severe competitive constraints. One of the devices that is used extensively for Ultra Large Scale Integration (ULSI) is the Field Effect Transistor (FET). The FET is typically fabricated on the surface of a semiconductor substrate by first creating a thin layer of oxide over the surface of the substrate. This layer of oxide serves as a stress release layer. Polysilicon gate electrodes are next patterned over the layer of oxide forming the gate electrode structure of the FET device. Insulating gate spacers are patterned over the polysilicon gate electrodes. Self-aligned source and drain regions are implanted adjacent to the gate electrodes thereby using the gate electrodes as implant or diffusion masks. Device performance can be significantly improved by reducing the sheet resistance of the surface of the polysilicon gate electrode and the regions where the metal contacts to the source/drain areas are established. The salicide process is used for this purpose by depositing a metal over the polysilicon gate electrodes and the self-aligned source/drain regions. The deposited metal is sintered thereby forming a silicide layer on the surface of the gate electrode and over the source and drain regions. Care must be taken during this process of selective removal of the unreacted metal to assure that no residual metal remains in place and that all silicide stringers, that potentially can extend over the gate spacers into the top surface of the gate electrode causing electrical shorts between the source/drain regions and the gate electrode, are removed.

The distance between the source and drain regions underneath the gate structure and within the surface of the substrate is the channel length of the gate. Present day devices use device structures where the gate width is in the quarter micron and deep sub-micron region. This severe reduction in device feature sizes is made possible by significant advances in supporting technologies such as the photolithographic process and anisotropic etching techniques. With the reduction of the gate width has come a reduction in channel length where present applications use channel width that are less than the above indicated gate width.

In order to form metal contacts to regions within semiconductor devices, an opening is etched through a dielectric layer so that an upper metal layer can be interconnected with a lower conductive layer. Metal contacts that are established in this manner do not need to be limited to metal contacts to source/drain regions and the gate electrode of a FET but can for instance include strap contacts in logic applications or bit line contacts in a DRAM. FIG. 1 (to be discussed later) shows an example of Prior Art formation of such a bit line contact in a DRAM.

Typically, a nitride etch stop layer is deposited on the region where the metal contact is to be established, this is followed by depositing a dielectric oxide layer, and then a photoresist is formed on the oxide layer which is patterned to define the desired pattern of openings that are to be etched through the underlying oxide layer. The oxide layer is selectively etched to the underlying nitride etch stop layer, the exposed nitride layer is removed (e.g. by hot $H_3PO_4$) and a liner (e.g. Ti/TiN) and contact metal (e.g. tungsten) are deposited in the openings followed by surface planarization of the device and removal of the photoresist.

It is important to point out that dry etching, such as plasma etching and reactive ion etching, has become the technology of choice in patterning various layers that are formed over a silicon wafer as it is processed to form therein high density integrated circuit devices. This is because it is a process that not only can be highly selective in the materials it etches, but also highly anisotropic. This makes possible etching with nearly vertical sidewalls.

As the downscaling in device feature sizes continues, the creation of these device features experiences a number of problems. With the further decrease in linewidth and decrease in the diameter of the openings that are created in semiconductor devices, the supporting photolithography technology has met these challenges by decreasing the wavelength of the photo exposure that is used to create the patterned layers of photoresist and which are used to define the dimensions of the linewidth and openings that are created in for instance layers of dielectric or etch stop layers. Currently, photo exposure radiation using Near Ultra-Violet (NUV) exposure with a wavelength of 365 nm is applied; this enables the creation of device features down to the 0.35-micron range. The most advanced photo exposure techniques use Deep Ultra Violet (DUV) exposure with a wavelength of 245 nm that enables the creation of device features down to the 0.18 um range. While the photolithography technology will continue to increase its exposure capabilities in support of decreasing device feature sizes, it is also important to provide methods and materials that further assist in the reduction of semiconductor device features. These methods will assist and facilitate design efforts and advances in the field of photolithography that combined will enable future progress in reducing device features and, with that, progress in improved device performance.

FIG. 1 provides an overview of the Prior Art creation of metal contact for a typical DRAM cell. The DRAM structure is formed on the surface of a semiconductor substrate 10. The formation of the DRAM cell starts with the isolation of the active area of the DRAM by means of the layer 12 of LOCOS that is formed around the active area. A layer of Field Oxide (FOX) is also typically used for this purpose; the isolating layer of oxide is a relatively thick layer of oxide between about 3000 and 6000 Angstrom. For the silicon substrate, typically a P-type single crystal with a crystallographic orientation of (100) is used. A thin (about 100 Angstrom thick) layer of gate oxide (not shown) is grown over the silicon surface to serve as stress release. A layer 14 of polysilicon is blanket deposited over which a layer of insulating material (not shown) is deposited. These two layers are patterned and etched to form gates 14 within the active area of the device and gates 18 on the surface of the LOCOS insulating area of the device. Gates 14 in the active area of the device form the gates of the MOSFET device, gates 18 form the word lines that connect the MOSFET gates to the peripheral circuits that are connected to the DRAM chip. The Lightly Doped (LDD) regions 20 and 22 for the source and drain regions of the N-channel MOSFET are then formed, typically by implant of an N-type dopant such as arsenic or phosphorous. Next the gate spacers 16 are formed over the surface of the patterned polysilicon gates 14 and 18. These spacers are typically formed by blanket depositing of a layer of low temperature silicon oxide and etching this layer anisotropically to the surface of the substrate. The source 24 and drain 26 regions are formed by implant with an N-type dopant, for instance arsenic. The self-aligned bit-line contact and the self-aligned storage node contacts 29 are formed by conventional methods of lithography and patterning. One (or more) layers 30 of insulation are then deposited over the structure to provide protection from further processing steps. The insulating layer may contain silicon oxide or silicon nitride. Over the insulating layer a further layer of dielectric may be deposited. The self-aligned bit-line contact 28 and the self-aligned storage node contacts 29 form the metal interconnects to the drain region 26 and the source regions 24 of the DRAM device. It is the creation of these metal interconnects and other similar electrical contacts that are part of semiconductor devices that is the subject of the invention.

The invention teaches a method whereby recent improvements in the photolithographic process in the definition of device metal contact regions are enhanced by the use of a layer of SiON that is deposited prior to the expose and etch of the openings for the metal contacts. This added layer of SiON however introduces stress between it and the underlying layer of dielectric during subsequent steps of contact anneal causing the created layer of metal for the metal contact to tilt. The invention teaches a method whereby this tilt is eliminated thus providing a method for improved photolithographic definition without simultaneously introducing any negative side effects.

U.S. Pat. No. 5,536,681 (Jang et al.) shows a PE-OX/$O_3$-TEOS gap with a $N_2$ treatment on PEOX.

U.S. Pat. No. 5,744,378 (Homma) shows an oxide/SiON layer over an interconnect. However, this reference differs from the invention.

U.S. Pat. No. 5,071,790 (Kim) teaches a SION layer over an ILD layer.

SUMMARY OF THE INVENTION

A principle objective of the invention is to provide a method for making contact plugs for devices with sub-micron or deep sub-micron device features.

Another objective of the invention is to provide a method of making contact plugs that have a cross section in the sub-micron or deep sub-micron range.

Yet another objective of the invention is to provide a method of making contact plugs for devices with sub-micron or deep sub-micron device features that retain the desired plug profile without being exposed to plug tilt during subsequent steps of processing.

A still further objective of the invention is to provide a method of applying Deep Ultra Violet (DUV) photolithographic exposure techniques thereby facilitating the use of making contact plugs for devices with sub-micron or deep sub-micron device features.

It is another objective of the invention to reduce the stress between a SiON stop layer and the underlying layer of dielectric during subsequent steps of semiconductor processing.

It is yet another objective of the invention to improve the contact between metal plugs and the overlying layer of interconnect metal.

In accordance with the objectives of the invention a new method is provided for the creation of metal plugs. After the gate electrode structures have been created, the Inter Level Dielectric (ILD) is deposited over the poly gates. The layer of ILD is polished, a second layer of dielectric is deposited over the layer of ILD. A stop layer is deposited over the second layer of dielectric, a Rapid Thermal Annealing (RTA) is performed to the stop layer and the second layer of dielectric. The metal plugs are then patterned and deposited after which the process proceeds for the further creation of the interconnect metal.

BRIEF DESCRIPTION OF THE DRAWINGS

FIG. 1 shows an overview of the creation of a Prior Art DRAM cell.

FIG. 2 shows a cross section of gate structures with an overlying layer of Inter Level Dielectric.

DESCRIPTION OF THE PREFERRED EMBODIMENTS

Figure 3:
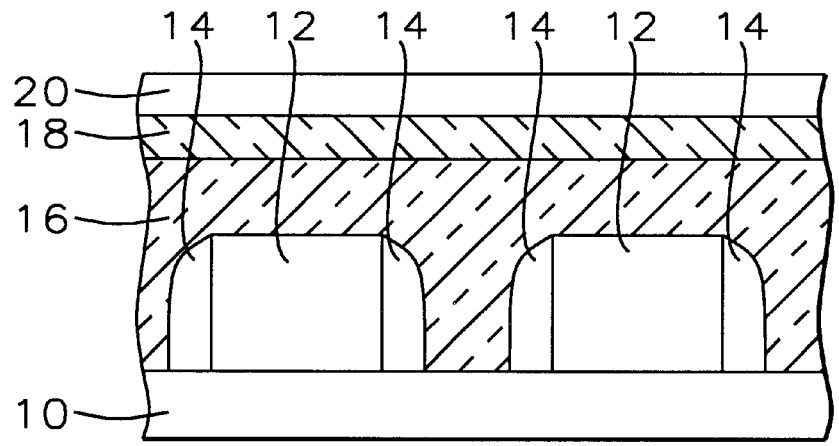
FIG. 3 shows a cross section of the gate structures of FIG. 2 with the addition of a deposited layer of dielectric and an etch stop layer.

Referring now specifically to FIG. 2, there is shown a cross section of polysilicon gates 12 that have been created on the surface of a silicon substrate 10. Gate spacers 14 have also been created; a layer 16 of dielectric has been blanket deposited over the gate electrodes and the exposed surface of the substrate 10.

It must be noted in FIG. 2 that only those design features and processing steps that apply to the invention are detailed. It is for instance common practice to start the creation of gate electrodes by first creating a layer of gate oxide on the surface of the substrate. This layer of gate oxide can be created by thermally oxidizing the device region thereby forming a thin layer of oxide that is typically between about 30 and 80 Angstrom thick. The layer created under the gate electrode can also be created using tantalum oxide in which case the preferred thickness of the layer is between about 80 and 120 Angstrom.

Gate electrode 12 can be formed by CVD using polysilicon or SiGe. Conventional photolithographic techniques and anisotropic plasma etching are used to pattern the gate structure. Polysilicon layer 12 is preferably deposited using Low Pressure CVD (LPCVD), the thickness of the polysilicon layer is between about 1500 and 3000 Angstrom and can be doped with a n+conductive dopant, for instance arsenic, with a preferred dopant concentration between about $1.2E20$ and $2.8E20$ atoms/cm$^3$.

The gate spacers 14 are formed on the sidewalls of the gate electrode 12. These sidewalls spacers can be formed by depositing a conformal first insulating layer, preferably a low temperature $SiO_2$, and anisotropically plasma etching back to the surface of the substrate 10. For example, the $SiO_2$ can be a chemical vapor deposition (CVD) using tetra-ethyl-ortho-silicate (TEOS) at a temperature between about 650 and 900 degrees C. while the etchback can be a reactive ion etcher (RIE).

The gate spacers can also be formed by a process including a substantially conformal deposition within the polysilicon trenches of a spacer material selected from the group consisting of nitride, oxide, BSG, PSG and any combination thereof, and a subsequent, substantially anisotropic etch of the spacer material.

The ILD layer 16 can be deposited by LPCVD using a reactant gas such as TEOS followed by dielectric CMP planarization to a ILD thickness greater than the height of the gate electrode and more specifically between about 10000 and 15000 Angstrom.

The layer 16 can form a layer of Inter Level Dielectric (ILD) but can also form a level of Intra-Metal Dielectric (IMD), dependent on the type of metal plug that is being formed. This layer can be applied as an ILD for SRAM devices in which case the material BPEOS is recommended for use. This layer of dielectric can also be used for IMD/ILD for logic devices in which case BPEOS and PETEOS are recommended for use.

FIG. 3 shows the deposition of a layer 18 of dielectric and an etch stop layer 20 of SiON.

The dielectric layer 18 can be deposited by LPCVD but in this case by using a reactant gas such as PETEOS to a thickness between about 500 and 2000 Angstrom.

Layer 20 is an etch stop layer, deposited to a thickness of between about 500 and 1500 Angstrom and deposited using a thermal or CVD deposition process.

As part of FIG. 3 and as the essence of the invention the deposited layers 18 and 20 of SiON and PETEOS dielectric are submitted to a Rapid Thermal Anneal (RTA). This anneal is typically performed at a temperature between about 900 and 1100 degrees C. for a time period of between about 10 and 60 seconds. It is this process of anneal that strengthens and unifies the combined layers 18 and 20 to the point where the stress, that typically occurs between the stop layer of SiON and the underlying ILD dielectric during subsequent steps of processing of the semiconductor device, is eliminated. In Prior Art applications, this stress results in shifting or tilting of the metal plug that is formed within openings created through these two layer 18 and 20. By first depositing a layer of (especially selected and for this purpose particularly beneficial) dielectric over the layer of ILD followed by depositing the stop layer followed by performing a RTA to the two layers of dielectric and stop layer, a layer is created on the surface of the ILD that does not exert stress on the underlying ILD during subsequent steps of device processing.

After the above indicated RTA has been completed, the process of creating metal interconnects to the underlying substrate 10 can now continue, this as follows and in accordance with standard processing procedures: a layer of photoresist is deposited over the stop layer, the photoresist is patterned and etched, the openings for the metal contacts are etched. It must be noted that this etch is an etch through the newly created layer of stop/dielectric layer into and through the layer of ILD down to the surface of the substrate. The photoresist is removed, the newly created layer of stop/dielectric stays in place and forms a permanent part of the ILD on top of the ILD. The steps of selectively depositing a barrier and a seed layer over the surfaces of the created opening for the metal contacts can then be performed. The metal for the contact plugs, for instance tungsten, is next blanket deposited over the surface of the newly created stop/dielectric layer and into the openings for the metal plugs, the excess metal is removed by CMP down to the surface of the stop/dielectric layer. The creation of the metal plugs is now complete and the partially completed device is ready for metal interconnect personalization. This procedure is referred to as the standard "back-end" processing of creating metal interconnect patterns and consists of depositing a layer of metal over the planarized surface of the metal plug and the exposed stop/dielectric layer. This layer of metal is then personalized with the typical steps of photoresist, patterning and etching.

Figure 4:
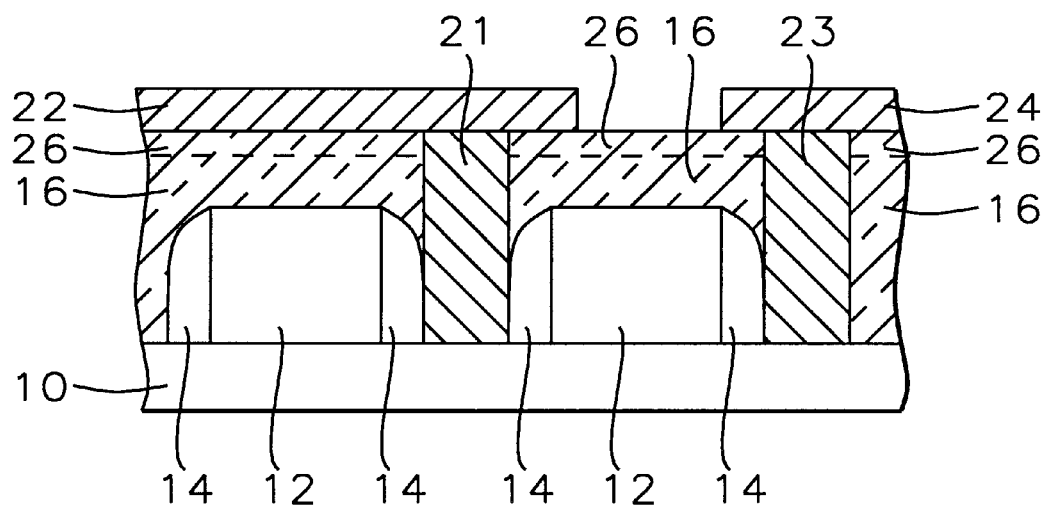
FIG. 4 shows a cross section of the gate structures after the contact plug has been formed and an overlying layer of metal has been created.

FIG. 4 shows a cross section after the previously indicated steps of metal personalization have been completed. Openings 21 and 23 for the metal plugs have been created and filled with barrier and seed layers (not shown) and a metal, for instance tungsten. The metal layer 22 and 24 has been deposited over the surface of the newly created layer 26 of stop/dielectric and has been patterned. It is clear that the metal layer 22 connects the metal plug 21 to the surrounding circuits while metal layer 24 connect metal plug 23 to the surrounding circuits. The surface of ILD 16 has, in accordance with the invention, been modified and extended by layer 26 where layer 26 is the stop/dielectric layer on which the process of RTA has been performed.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creating openings for metal contact plugs in a layer of Dielectric of a semiconductor device, comprising the steps of:

providing a semiconductor substrate;

forming a gate electrode structure on the surface of said substrate, leaving the surface of said substrate partially exposed;

depositing a first layer of dielectric over said gate electrode structure and the exposed surface of said substrate, then;

depositing a second layer of dielectric comprising PETEOS over said first layer of dielectric, then;

depositing a stop layer comprising SiON over the surface of said second layer of dielectric; and then applying a Rapid Thermal Anneal by applying a temperature between about 900 and 1100 degrees C. for a time period of between about 10 and 60 seconds to the surface of said stop layer, creating an annealed stop layer.

2. The method of claim 1 wherein said forming a gate structure on the surface of said substrate comprises the steps of:

forming Field Isolation Regions, isolating active areas from surrounding areas of the semiconductor substrate;

creating a layer of gate oxide on the surface of said active regions of said substrate;

depositing a layer of polysilicon over said gate oxide;

patterning and etching said layer of polysilicon, forming said gate electrode structures;

forming LDD regions for source and drain regions of the gate electrodes by light implanting of dopants into these regions, said implanting being self-aligned with said gate electrode structures;

forming gate spacers on sidewalls of said gate electrode structures, furthermore creating contact openings within said partially completed structure; and performing heavy implanting of dopants into source and drain regions of the gate electrodes, said implanting being self-aligned with said gate electrode structures.

3. The method of claim 1 wherein said first layer of dielectric is deposited by LPCVD using BPEOS as reactant gas followed by dielectric CMP planarization to a dielectric thickness greater than the height of said gate electrode and more specifically between about 10000 and 15000 Angstrom.

4. The method of claim 1 wherein said first layer of dielectric is deposited by LPCVD using PETEOS as reactant gas followed by dielectric CMP planarization to a dielectric thickness greater than the height of the gate electrode and more specifically between about 10000 and 15000 Angstrom.

5. The method of claim 1 wherein said first layer of dielectric is deposited by LPCVD using BPEOS and PETEOS as reactant gasses followed by dielectric CMP planarization to a dielectric thickness greater than the height of the gate electrode and more specifically between about 10000 and 15000 Angstrom.

6. The method of claim 1 wherein said depositing a second layer of dielectric is depositing a layer of PETEOS using LPCVD to a thickness of between about 500 and 2000 Angstrom.

7. The method of claim 1 wherein said depositing a stop layer is depositing a layer of SiON using LPCVD to a thickness between about 500 and 1500 Angstrom.

8. The method of claim 1 wherein said applying a Rapid Thermal Anneal to the surface of said stop layer is applying a temperature between about 900 and 1100 degrees C. for a time period of between about 10 and 60 seconds.

9. The method of claim 1 with the additional steps of forming metal contact plugs and metal interconnects, said additional steps comprising:
   patterning and etching openings for said metal contact plugs;
   blanket depositing a layer of metal over said annealed stop layer and into said openings for said metal contact plugs;
   removing excess metal from the surface of said annealed stop layer, forming said metal contact plugs;
   blanket depositing a layer of metal over the surface of said contact plugs and the surface of said annealed stop layer; and
   patterning and etching said deposited layer of metal, forming said metal interconnects.

10. The method of claim 9 with the additional steps of selectively depositing a barrier layer and a seed layer over the surfaces of said created opening for said metal contact plugs said additional steps to be performed prior to said step of blanket depositing a layer of metal over the surface of said annealed stop layer and into said openings for said metal plugs.

11. The method of claim 10 with the additional step of performing an anneal between the deposited seed layer and said metal plugs said anneal to be performed after the formation of said metal plugs.

12. A method for creating openings for metal contact plugs in a layer of Dielectric of a semiconductor device, comprising the steps of:
   providing a semiconductor substrate;
   forming a gate structure on the surface of said substrate, leaving the surface of said substrate partially exposed, said gate structure being formed in active regions on the surface of said substrate, said active regions being bounded by isolation regions in the surface of said substrate, said gate structure comprising several gate electrodes with gate electrode spacers on sidewalls of said gate electrodes, furthermore self-aligned source and drain regions having been created in the surface of said substrate;
   depositing a first layer of dielectric over said gate electrode structure and said exposed surface of said substrate, then;
   depositing a second layer of dielectric by depositing a layer of PETEOS using LPCVD to a thickness of between about 500 and 2000 Angstrom, then;
   depositing a stop layer by depositing a layer of SiON using LPCVD to a thickness between about 500 and 750 Angstrom; and then
   applying a Rapid Thermal Anneal to the surface of said stop layer, creating an annealed stop layer, by applying a temperature between about 900 and 1100 degrees C. for a time period of between about 10 and 60 seconds.

13. The method of claim 12 wherein said first layer of dielectric is deposited by LPCVD using BPEOS as reactant gas followed by dielectric CMP planarization to a dielectric thickness greater than the height of said gate electrode and more specifically between about 10000 and 15000 Angstrom.

14. The method of claim 12 wherein said first layer of dielectric is deposited by LPCVD using PETEOS as reactant gas followed by dielectric CMP planarization to a dielectric thickness greater than the height of the gate electrode and more specifically between about 10000 and 15000 Angstrom.

15. The method of claim 12 wherein said first layer of dielectric is deposited by LPCVD using BPEOS and PETEOS as reactant gasses followed by dielectric CMP planarization to a dielectric thickness greater than the height of the gate electrode and more specifically between about 10000 and 15000 Angstrom.

16. The method of claim 12 with the additional steps of forming metal contact plugs and metal interconnects, said additional steps comprising:
   patterning and etching openings for said metal contacts;
   blanket depositing a layer of metal over the surface of said annealed stop layer and into said openings for said metal plugs;
   removing excess metal from the surface of said annealed stop layer, forming said metal contact plugs;
   blanket depositing a layer of metal over the surface of said contact plugs and the surface of said annealed stop layer; and
   patterning and etching said deposited layer of metal, forming said metal interconnects.

17. The method of claim 12 with the additional steps of selectively depositing a barrier layer and a seed layer over the surfaces of said created opening for said metal contact plugs, said additional steps to be performed prior to said step of blanket depositing a layer of metal over the surface of said annealed stop layer and into said openings for said metal plugs.

18. The method of claim 17 with the additional step of performing an anneal between the deposited seed layer and said metal plugs, said anneal to be performed after the formation of said metal plugs.

19. A method for forming contact openings in a layer of dielectric, said contact openings being used for creation of conductive contact plugs, said conductive plugs forming an electrical interface between an overlying layer or contact point of interconnect metal and an underlying layer or contact point of interconnect metal, comprising the steps of:
   depositing said dielectric over the surface of the underlying layer or contact point of interconnect metal, including any device elements that surround or are in close proximity to said underlying layer or contact point of interconnect metal;
   planarizing said dielectric, then;
   depositing a thin layer of dielectric containing PETEOS over said planarized layer of dielectric, then;
   depositing a stop layer containing SiON over said thin layer of dielectric, then;
   performing a Rapid Thermal Anneal to said thin layer of dielectric and said stop layer; and then
   patterning said dielectric, including said annealed layer of thin dielectric and stop layer, forming said contact openings in said dielectric for said conductive contact plugs, said openings aligning with said underlying layer or contact point of interconnect metal.

* * * * *